(12) United States Patent
Trindade et al.

(10) Patent No.: US 11,670,603 B2
(45) Date of Patent: Jun. 6, 2023

(54) MICRO-COMPONENT ANTI-STICTION STRUCTURES

(71) Applicant: X-Celeprint Limited, Dublin (IE)

(72) Inventors: António José Marques Trindade, Cork (IE); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 153 days.

(21) Appl. No.: 17/366,842

(22) Filed: Jul. 2, 2021

(65) Prior Publication Data

US 2021/0375795 A1 Dec. 2, 2021

Related U.S. Application Data

(63) Continuation of application No. 16/886,619, filed on May 28, 2020, now Pat. No. 11,088,093.

(51) Int. Cl.
*H01L 23/58* (2006.01)
*H01L 23/544* (2006.01)

(52) U.S. Cl.
CPC ............ *H01L 23/58* (2013.01); *H01L 23/544* (2013.01); *H01L 2223/54426* (2013.01)

(58) Field of Classification Search
CPC ................... H01L 23/58; H01L 23/544; H01L 2223/54426
See application file for complete search history.

(56) References Cited

U.S. PATENT DOCUMENTS

| | | | |
|---|---|---|---|
| 5,159,181 A | 10/1992 | Bartels et al. | |
| 7,622,367 B1 | 11/2009 | Nuzzo et al. | |
| 7,943,491 B2 | 5/2011 | Nuzzo et al. | |
| 8,039,847 B2 | 10/2011 | Nuzzo et al. | |
| 8,506,867 B2 | 8/2013 | Menard | |
| 8,722,458 B2 | 5/2014 | Rogers et al. | |
| 8,889,485 B2 | 11/2014 | Bower | |
| 10,198,890 B2 | 2/2019 | Rotzoll et al. | |
| 10,222,698 B2 | 3/2019 | Prevatte et al. | |
| 10,468,363 B2 | 11/2019 | Prevatte et al. | |
| 2003/0170921 A1 | 9/2003 | Akram | |
| 2003/0201525 A1 | 10/2003 | James et al. | |

(Continued)

FOREIGN PATENT DOCUMENTS

CN 104237568 A * 12/2014
WO WO-2021/239472 A1 12/2021

OTHER PUBLICATIONS

International Search Report, International Application No. PCT/EP2021/062745, filing date May 12, 2021, 8 pages, (Oct. 18, 2021).

(Continued)

*Primary Examiner* — Mamadou L Diallo
(74) *Attorney, Agent, or Firm* — Choate, Hall & Stewart LLP; Michael D. Schmitt

(57) ABSTRACT

A micro-component comprises a component substrate having a first side and an opposing second side. Fenders project from the first and second sides of the component substrate and include first-side fenders extending from the first side and a second-side fender extending from the second side of the component substrate. At least two of the first-side fenders have a non-conductive surface and are disposed closer to a corner of the component substrate than to a center of the component substrate.

20 Claims, 16 Drawing Sheets

(56) References Cited

U.S. PATENT DOCUMENTS

| | | | |
|---|---|---|---|
| 2006/0001046 A1 | 1/2006 | Batres et al. | |
| 2011/0186089 A1* | 8/2011 | Je | B81B 3/001 134/198 |
| 2011/0189440 A1* | 8/2011 | Appleby | B22C 9/10 523/435 |
| 2012/0313235 A1* | 12/2012 | Chu | B81B 3/001 257/692 |
| 2013/0127036 A1* | 5/2013 | Kuo | B81B 3/001 257/E23.181 |
| 2013/0340526 A1* | 12/2013 | Liu | G01C 19/5769 73/514.32 |
| 2015/0181766 A1* | 6/2015 | Lu | H01L 24/18 361/728 |
| 2016/0093600 A1 | 3/2016 | Bower et al. | |
| 2017/0047303 A1* | 2/2017 | Meitl | H01L 24/81 |
| 2017/0338542 A1* | 11/2017 | Cok | H01Q 1/2225 |
| 2018/0007750 A1* | 1/2018 | Meitl | H01L 22/24 |
| 2018/0031974 A1* | 2/2018 | Prevatte | H05K 3/305 |
| 2018/0042118 A1 | 2/2018 | Kondo et al. | |
| 2020/0177163 A1* | 6/2020 | Cok | H03H 3/02 |
| 2020/0395510 A1* | 12/2020 | Bower | H01L 27/156 |
| 2021/0036736 A1* | 2/2021 | Uchimura | H01Q 15/0026 |

OTHER PUBLICATIONS

Written Opinion, International Application No. PCT/EP2021/062745, filing date May 12, 2021, 14 pages, (Oct. 18, 2021).

* cited by examiner

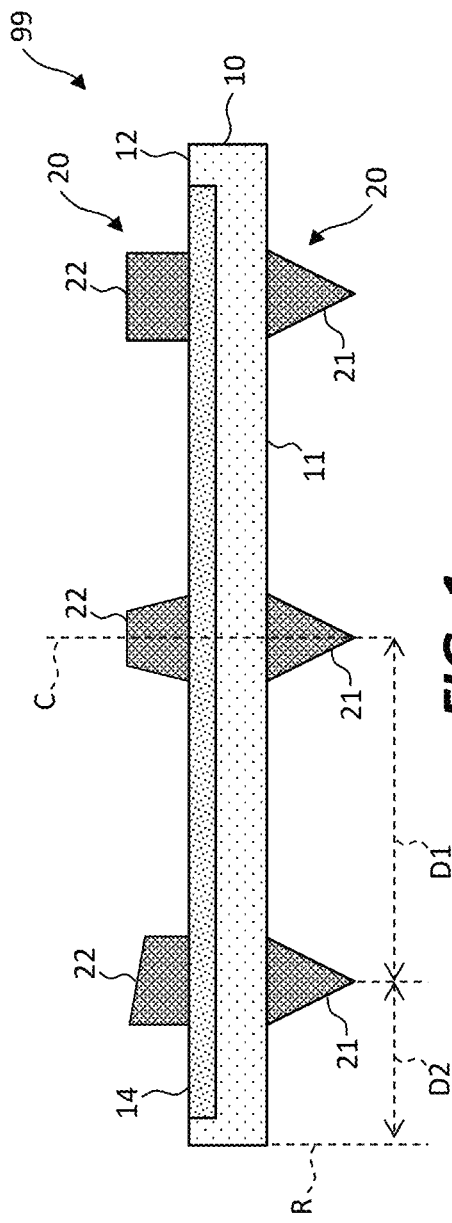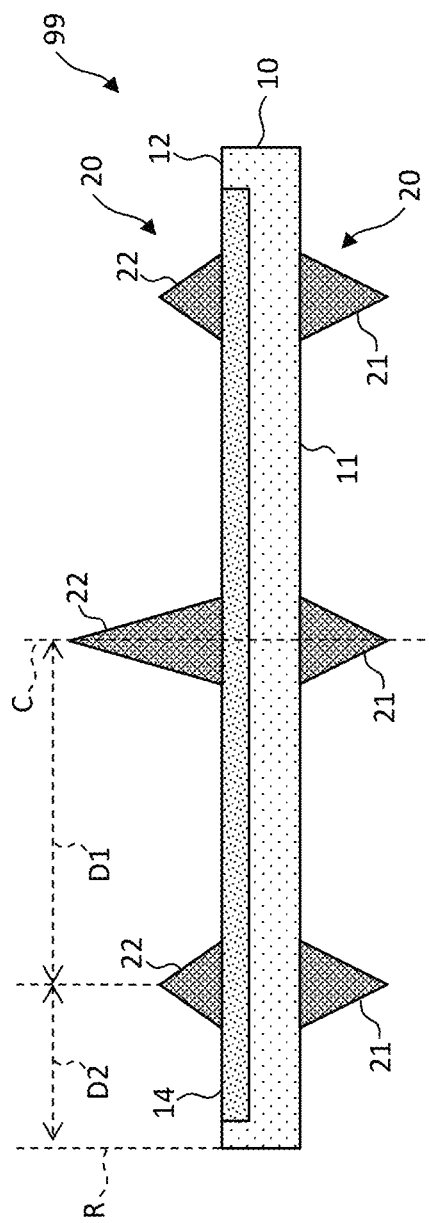

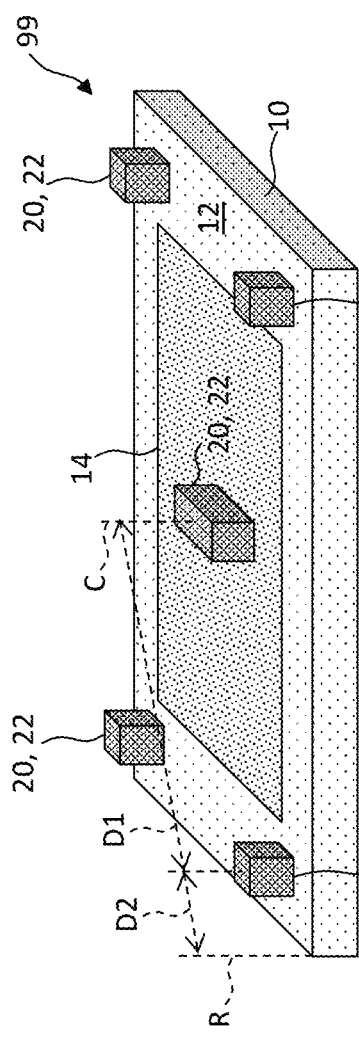
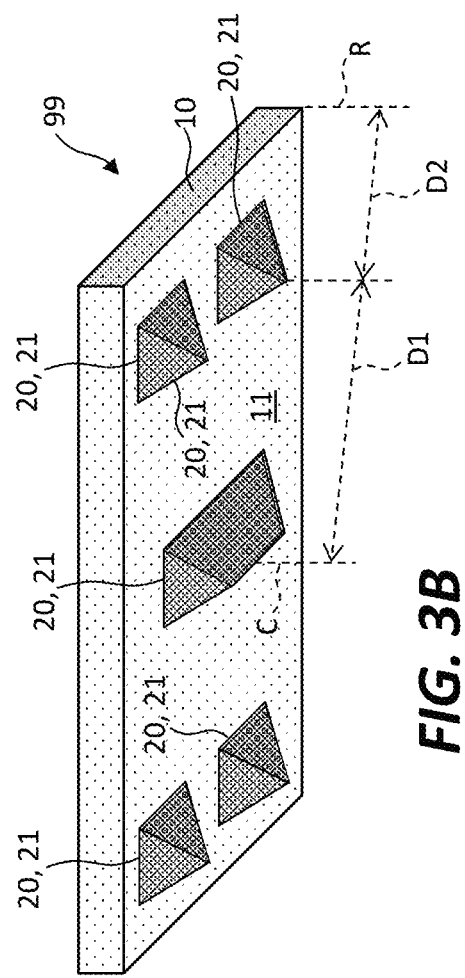
FIG. 3A
FIG. 3B

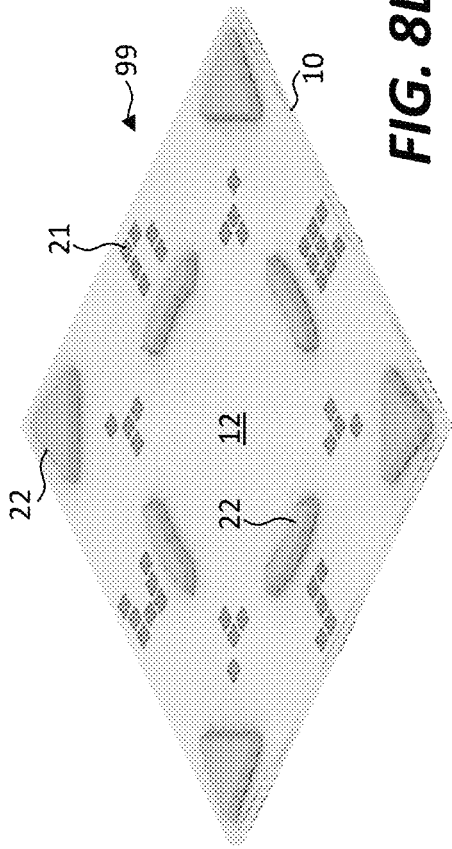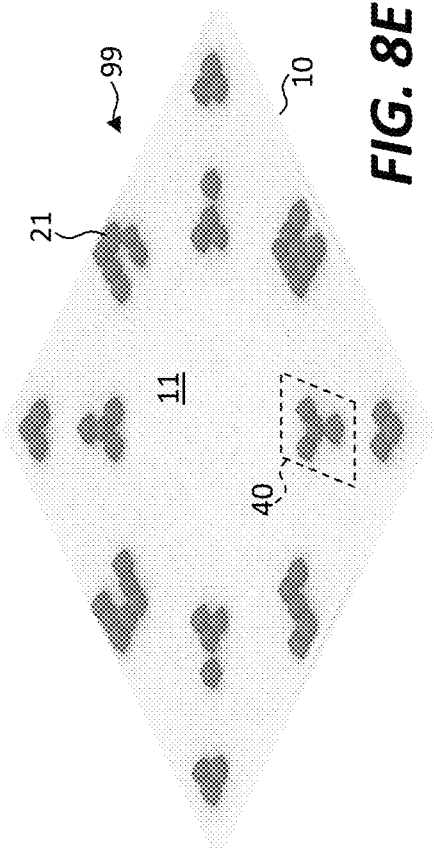

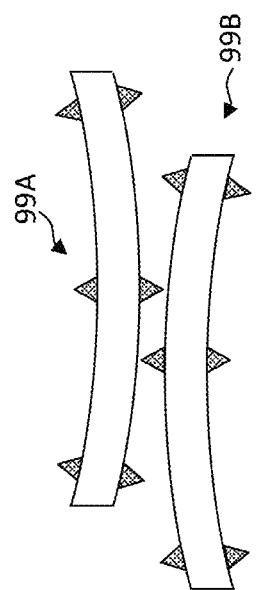

US 11,670,603 B2

MICRO-COMPONENT ANTI-STICTION STRUCTURES

PRIORITY APPLICATION

This application is a continuation of U.S. patent application Ser. No. 16/886,619, filed on May 28, 2020, the disclosure of which is hereby incorporated by reference in its entirety.

TECHNICAL FIELD

The present disclosure relates to micro-components with structures to overcome stiction and avoid agglomeration of the micro-components.

BACKGROUND

Integrated circuits are widely used in electronic devices. Most integrated circuits are packaged in ceramic or plastic carriers and are relatively large, for example having dimensions of one millimeter or more. However, in recent years micro-components with sizes in the micron range are proposed for use in portable or other small electronic devices or for larger devices in which size and weight are important considerations. Such micro-components can be constructed using conventional photolithographic methods and materials, but it can be difficult to handle the micro-components because of their small size.

Methods for transferring small, active components from one substrate to another are described in U.S. Pat. Nos. 7,943,491, 8,039,847, and 7,622,367. In an example of these approaches, small integrated circuits are formed on a native semiconductor source wafer. The small, unpackaged integrated circuits, or chiplets, are released from the native source wafer by pattern-wise etching portions of a sacrificial layer located beneath the chiplets, leaving each chiplet suspended over an etched sacrificial layer portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate. U.S. Pat. No. 8,722,458 entitled Optical Systems Fabricated by Printing-Based Assembly teaches related examples of transferring light-emitting, light-sensing, or light-collecting semiconductor elements from a wafer substrate to a destination substrate or backplane.

In some applications, however, it can be useful to transfer large volumes of micro-components in a less structured way. For example, a large quantity of micro-components can be stored in an unstructured arrangement in a container for subsequent deposition within a device or structure or for distribution over a surface.

SUMMARY

When micro-components and micro-component structures are stored and/or transferred in an unstructured arrangement, there is a need, for micro-component and micro-component structures and processes that prevent the micro-components from sticking together and facilitate handling individual micro-components. According to some embodiments of the present disclosure, a micro-component comprises a component substrate having a first side and an opposing second side. Fenders project, protrude, and extend from the first and second sides of the component substrate and include at least first-side fenders extending from the first side and a second-side fender extending from the second side of the component substrate. At least two of the first-side fenders have a non-conductive surface and are disposed closer to a corner of the component substrate than to a center of the component substrate. According to some embodiments, the component substrate comprises a center and an edge, and one or more fenders are closer to the center than to the edge of the component substrate. According to some embodiments, the micro-component comprises one or more fenders that are closer to the edge than to the center of the component substrate.

According to some embodiments, the first-side fenders are a solid dielectric, the first-side fenders comprise a same material as the component substrate, or both. One or more of the fenders can have a substantially sharp point on a side or end of the fender opposite the component substrate, a substantially sharp edge on a side or end of the fender opposite the component substrate, or both. The first-side fenders can be pyramidal. The second-side fenders can have a substantially planar surface on a side of the second-side fender opposite the component substrate. One or more of the fenders can be electrically conductive. One or more of the fenders can be a multi-layer fender.

One or more of the fenders can comprise an electronic, optical, or opto-electronic structure. According to some embodiments, micro-components comprise a circuit disposed in or on the component substrate. The second-side fender can be an electrically conductive fender electrically connected to the circuit or the second-side fender can comprise at least a portion of the circuit.

According to some embodiments, one or more of the fenders extends a distance of five microns or more from the height or surface of the circuit on or over the component substrate, a distance of ten microns or more from the or surface of the circuit on or over the component substrate, or a distance of fifteen microns or more from the height or surface of the circuit on or over the component substrate. One or more of the fenders can extend no less than five microns from a surface of the component substrate, one or more of the fenders can extend no less than ten microns from a surface of the component substrate, or one or more of the fenders can extend no less than fifteen microns from a surface of the component substrate.

According to some embodiments, the component substrate is curved and the height of at least one of the fenders is greater than or equal to the distance orthogonally between a secant intersecting the ends of the component substrate and the center of the substrate. The height of at least one of the fenders can be greater than or equal to twice the distance orthogonally between the secant and the center of the substrate.

According to some embodiments, a first fender has a surface at a first angle to the component substrate and a second fender has a surface at a second angle to the component substrate that is different from the first angle, a first fender has a size or shape that is different from a size or shape of a second fender, a first fender has a different height than a height of the second fender, or any one or combination of these.

According to some embodiments, the second-side fender is closer to an edge or closer to a corner of the component substrate than to a center of the component substrate. According to some embodiments, a micro-component comprises two or more second-side fenders and one or more of the two or more second-side fenders is closer to an edge or closer to a corner of the component substrate than to a center of the component substrate, one or more of the two or more second-side fenders is closer to a center of the component substrate than to an edge or a corner of the component substrate, or both.

According to some embodiments, one or more of the fenders forms an alignment structure. A first portion or group of the fenders can form a first alignment structure and a second portion or group of the fenders can form a second alignment structure and the first alignment structure and the second alignment structure can form an orientation alignment structure. At least one or more of the first-side fenders can form a first alignment structure on the first side of the component substrate and at least one or more of the second-side fenders can form a second alignment structure on the second side of the component substrate that is different from the first alignment structure.

One or more of the fenders can be a tiered fender.

According to embodiments of the present disclosure, a system comprises a plurality of micro-components disposed loosely in a container.

According to embodiments of the present disclosure, a micro-component comprises a component substrate having a first side, fenders extending from the first side of the component substrate, wherein (i) at least two of the fenders have a non-conductive surface and (ii) the fenders are arranged to indicate or encode information. In some embodiments, the micro-component comprises a circuit disposed on or in the component substrate and the information is (i) a property or characteristic of the circuit or (ii) identification information that identifies the circuit. In some embodiments, the fenders are each disposed closer to a corner of the component substrate than to a center of the component substrate.

According to some embodiments of the present disclosure, a method of providing micro-components on a target substrate comprises providing a target substrate and a container having micro-components disposed loosely in the container. Each of the micro-components can comprise a component substrate having a first side and a second side opposite the first side, a circuit disposed in or on the component substrate, and fenders, each of the fenders extending from one of the first side and the second side. The method can further comprise vibrating the container with a selected magnitude and frequency of vibration such that a plurality of the micro-components is dispensed from the container onto the target substrate. Some embodiments comprise moving the target substrate relative to the container at a desired rate while vibrating the container. At least two of the fenders can extend from the first side and at least one of the fenders can extend from the second side.

According to some embodiments of the present disclosure, the fenders are each disposed closer to a corner of the component substrate than to a center of the component substrate. At least two of the fenders can have a non-conductive surface. At least two of the fenders can be electrically conductive and the method can comprise electrically connecting at least two of the fenders.

Embodiments of the present disclosure provide micro-components and micro-component structures that enable or facilitate individual handling or manipulation of the micro-components and that prevent, inhibit, or deter the micro-components from adhering to each other or to other devices or structures in the absence of adhesive material.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1 and 2 are schematic cross sections of a micro-component with fenders according to illustrative embodiments of the present disclosure;

FIG. 3A is a top perspective and FIG. 3B is a bottom perspective of a micro-component with fenders according to illustrative embodiments of the present disclosure;

FIG. 8D is a top transparent perspective and FIG. 8E is a bottom perspective of fenders according to illustrative embodiments of the present disclosure;

FIGS. 10A-10E illustrate cross sections of curved component substrates and fenders with fenders of different sizes and locations according to illustrative embodiments of the present disclosure.

Figure 4A:
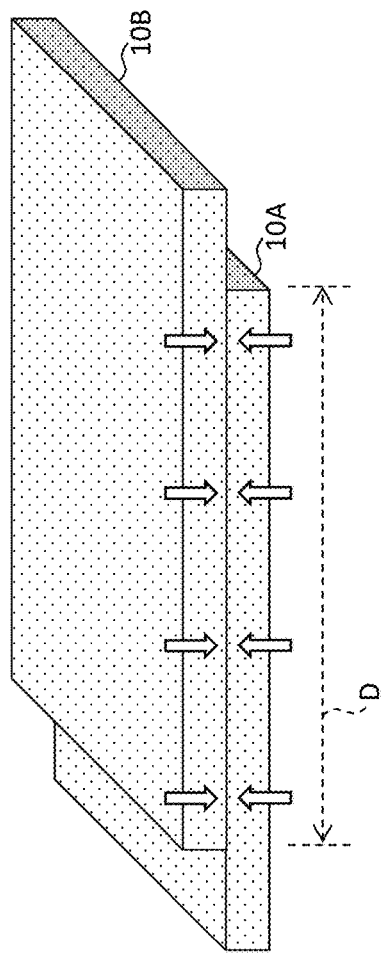
FIG. 4A is a schematic perspective of two substrates contacting over an area useful in understanding embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The Figures are not necessarily drawn to scale since the variation in size of various elements in the Figures is generally too great to permit depiction to scale.

DETAILED DESCRIPTION OF CERTAIN EMBODIMENTS

Embodiments of the present disclosure provide micro-components with structures that prevent or inhibit the micro-components from sticking together, for example due to van der Waals forces, electrostatic forces, hydrogen bonding, or other close-range or close-proximity attractive forces. In general, such forces and the tendency for surfaces to attract each other at microscopic ranges are referred to herein as stiction or static friction. Stiction is a force that resists relative motion or separation of stationary contacting surfaces, for example surfaces in physical contact or within micrometer (micron) or nanometer range. Contacting surfaces experiencing stiction can be closer than 10 microns, closer than 5 microns, closer than 3 microns, closer than 2 microns, closer than 1 micron, closer than 500 nm, closer than 250 nm closer than 100 nm, closer than 50 nm, closer than 20 nm, closer than 10 nm, closer than 5 nm, closer than 2 nm, or closer than 1 nm. The attractive force is related to the area of the surfaces in close contact or close range.

Micro-components, for example components with dimensions in the micron range or smaller, can be subject to stiction if randomly arranged in a container, either dry or within a liquid. Such micro-components are typically formed on planar substrates and the planar substrates of different micro-components can stick together and agglomerate or conglomerate into clumps or clusters, even in the absence of any adhesive layers or coatings on the micro-components. It is then difficult to separate the very small micro-components and individually manipulate them for a desired purpose, for example to distribute the micro-components randomly or regularly in a structure or over an area of a target substrate. In some applications, for example, it is useful to individually scatter micro-components over a target substrate. If the micro-components are clumped together, it is difficult to separate and scatter them effectively and individually. Even relatively larger micro-components, for example comprising substrates with areas of 100-by-100 microns to 500-by-500 microns can experience stiction because micro-component substrates can be relatively planar and such flat micro-component substrates can come into close contact and stick to other flat micro-component substrates. Such micro-components can be electronic or opto-electronic components or integrated circuits and can be made using photolithographic materials and methods. For example, U.S. Pat. No. 10,198,890 discloses small light-emitting modules disposed on or embedded in a document, and U.S. Patent Publication No. 2017/0338542 discloses an electromagnetic communication device of similar size.

According to some embodiments of the present disclosure and with reference to the cross sections of FIGS. 1 and 2 and the top and bottom perspective views of FIGS. 3A and 3B, respectively, a micro-component 99 comprises a component substrate 10 having a first side 11 and an opposing second side 12. First and second sides 11, 12 can be a first surface and opposing second surface, respectively, of component substrate 10 and can be substantially planar and parallel (e.g., to within 10 degrees) so that first side 11 is on a side of component substrate 10 opposite from second side 12 of component substrate 10. Component substrate 10 can be a wafer substrate, a portion of a wafer substrate, or a structure formed or disposed on a wafer substrate, for example, a semiconductor substrate or wafer, a display substrate, or other structures having opposed extensive and substantially planar sides, for example as are found in the integrated circuit or flat-panel display industries. Component substrate 10 can be a dielectric layer, for example comprising patterned silicon dioxide or silicon nitride.

Fenders 20 extend, project, and protrude from first side 11 and from second side 12 of component substrate 10. At least two fenders 20 are first-side fenders 21 extending away from first side 11 of component substrate 10 and at least one fender 20 is a second-side fender 22 extending away from second side 12 of component substrate 10 in a direction substantially opposite to the direction in which first-side fenders 21 extend. First-side fenders 21 and second-side fenders 22 are collectively fenders 20. Fenders 20 can, but do not necessarily, extend, project, or protrude from component substrate 10 farther than any other structure on component substrate 10. At least two, and in some embodiments three, four, or more of first-side fenders 21 have a non-conductive surface or composition (e.g., are electrically insulating and are not electrically conductive or are coated with a non-conductive material) and are disposed closer to a corner R of component substrate 10 than to a center C of component substrate 10. As shown in FIGS. 1-3B, some first-side and second-side fenders 21, 22 are disposed at a distance D2 from a corner R of component substrate 10 that is less than a distance D1 between first-side and second-side fenders 21, 22 and a center C of component substrate 10 and are therefore closer to corner R than to center C of component substrate 10. In FIGS. 1-3B, additional first-side and additional second-side fenders 21, 22 are disposed at or near center C of component substrate 10 or can be disposed elsewhere in a central area or near the edges of component substrate 10. Distance can be measured from a fender 20 center or any portion of a fender 20, such as an edge, corner, or end, of fender 20. By disposing fenders 20 close to corners R of component substrates 10, stiction between substantial areas of component substrates 10 is inhibited or prevented because fenders 20 fend off other planar structures so that a substantial area of the other planar structures cannot closely approach a substantial area of component substrate 10.

Fenders 20 can comprise any one or combination of insulating material (e.g., inorganic materials such as silicon dioxide or silicon nitride or organic materials such as cured epoxies or photoresists), electrically conductive material, multi-layer structures, electrically or optically active structures comprising patterned conductors, semiconductors, and dielectrics. In some embodiments, first-side fenders 21 are monolithic dielectric structures and can be wholly insulating. In some embodiments, second-side fenders 22 are monolithic dielectric structures and can be wholly insulating. Dielectric fenders 20 can avoid making electrical contact with other portions or structures on or in component substrate 10, thereby preventing undesired electrical conduction, for example conduction of electro-static current.

Figure 4B:
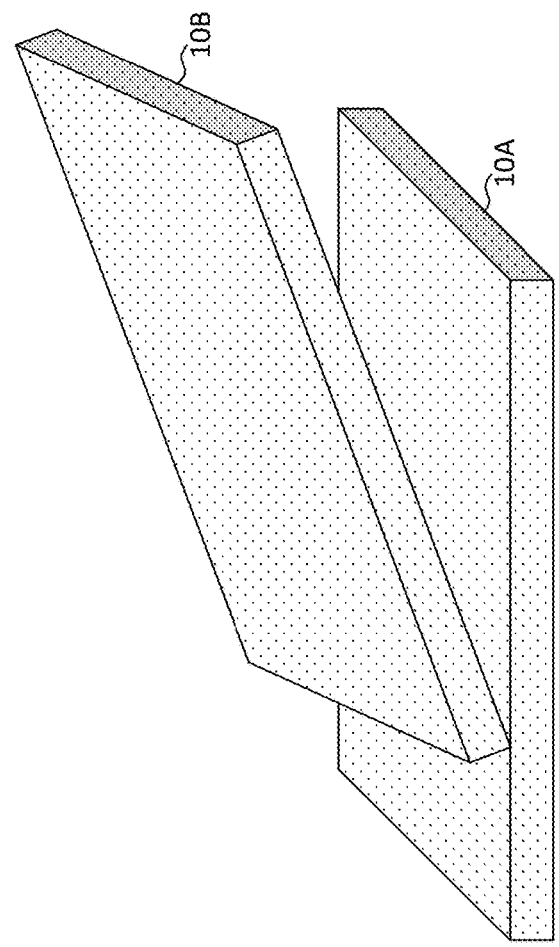
FIG. 4B is a schematic perspective of two substrates contacting at an angle useful in understanding embodiments of the present disclosure.
Figure 4C:
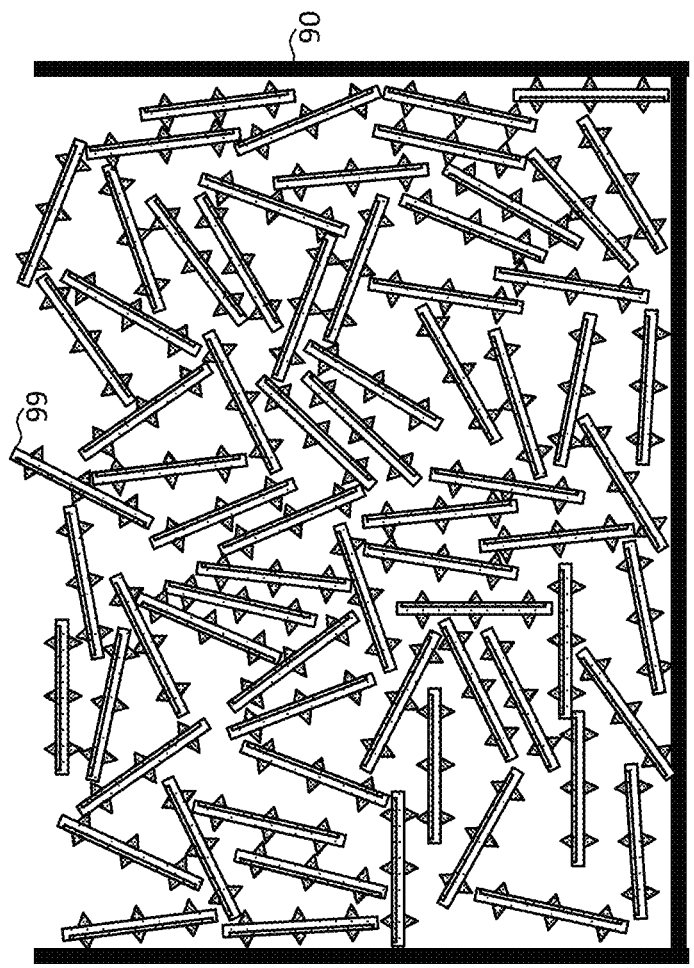
FIG. 4C is a schematic perspective of micro-components in a container according to illustrative embodiments of the present disclosure.

Referring to FIG. 4A, first and second component substrates 10A, 10B overlap by a distance D, are in physical contact or very close spatial and physical proximity and stick together as a consequence of short-range stiction forces, indicated by the arrows in FIG. 4A. To experience stiction, first and second component substrates 10A, 1.0B do not have to be similarly oriented or aligned, but do need to have sufficient component substrate area in close proximity that significant stiction occurs, as shown with overlapping distance D. In contrast and as shown in FIG. 4B, if first component substrate 10A is at an angle to second component substrate 10B, that is if the sides or surfaces of first component substrate 10A are at an angle (e.g., not substantially parallel) to second component substrate 10B, there is insufficient area of first and second component substrates 10A, 10B at a sufficiently close range to create strong stiction. In such arrangements, an edge or corner R of second component substrate 10B can contact a surface of first component substrate 10A but the area of contact is very small (substantially a line or point) so that significant or substantial stiction does not occur between first and second component substrates 10A 1.0B. According to some embodiments of the present disclosure, fenders 20 prevent significant areas of first and second component substrates 10A, 10B from spatially and physically approaching in close proximity or contact, and tend to force component substrates 10 into the arrangement of FIG. 4B rather than the arrangement of FIG. 4A, as shown in FIG. 4C, thereby preventing or inhibiting substantial, strong, or problematic stiction forces between first and second component substrates 10A, 10B. FIG. 4C illustrates many micro-components 99 with fenders 20 randomly and loosely disposed either dry or in a liquid carrier in a container 90, without any significant areas of one micro-component 99 in close contact with another micro-component 99 because of fenders 20. Fenders 20 can also prevent or inhibit stiction between micro-components 99 and a surface of container 90, for example an interior surface of container 90.

According to some embodiments of the present disclosure, a fender 20 can be a physical and structural ward, guard, bumper, standoff, or buffer that spatially and physically separates and keeps substantial areas of first and second component substrates 10A, 1.0B apart preventing sufficient or substantial areas of first and second component substrates 10A, 10B from closely approaching, thereby inhibiting substantial or significant stiction between first and second component substrates 10A, 10B. For example, a substantial area can be no less than 1%, 2%, 5%, 10%, 20%, 30%, or 40% of a surface or substrate area. Fenders 20 can be disposed directly on and in contact with component substrate 10 or on layers or other structures disposed directly on and in contact with component substrate 10.

According to some embodiments, micro-components 99 can comprise circuits 14 and component connection pads, for example, as shown in FIGS. 1, 2, 3A, 5A, and 5B. Micro-components 99 can be a self-contained, functional structure or be part of a larger system. In some embodiments, electrically active fenders 20 can provide power connections to micro-component 99 or power can be provided to micro-component 99 from internal sources (e.g., battery or capacitors) or through electromagnetic or other non-contact means (for example employing an antenna or a sensor that provides power). Circuits 14 and any component contact pads can be disposed (e.g., formed) in or on component substrate 10. Component contact pads can be electrically conductive areas of component substrate 10 that provide electrical contact to circuits 14, for example as are found in integrated circuits (ICs) or other electronic or opto-electronic devices such as light-emitting diodes (LEDs) or photosensors. Component contact pads can establish electrical connections internally within micro-component 99, e.g., to circuit 14 or externally to devices on a surface or substrate on which micro-components 99 are disposed.

Fenders 20 can be disposed on circuit 14 or component contact pads and can extend, for example, a distance of 100 nm to 100 microns from circuit 14 or component contact pads, for example 1 to 20 microns, for example 2 to 15 microns, for example 4 to 10 microns. Fenders 20 can have a height and can extend above component substrate 10 a distance that is greater than a height that circuits 14 and any component contact pads extend above component substrate 10. Some fenders 20 can have a height of at least one to five microns above any other element of micro-component 99, for example circuit 14 elements.

Fenders 20 can have a great variety of shapes and sizes. For example, and as shown in FIGS. 1 and 6A-6H, fenders 20 can have polygonal cross sections, for example quadrilateral (e.g., square, rectangular, or trapezoidal) or triangular, and can comprise pyramids, cubes or other structures that can be disposed on component substrate 10. Fenders 20 can have a distal area (an area of the distal end of fenders 20 farthest from component substrate 10) smaller than a proximal area (an area of the proximal end of fenders 20 closest to or in contact with component substrate 10). Fenders 20 can have a substantially sharp point on a distal side or end of fender 20 opposite component substrate 10 and projecting from component substrate 10 (e.g., as shown for first-side fenders 21 of FIGS. 1 and 2, second-side fenders 22 of FIG. 2, and FIG. 6E), or can have a substantially sharp distal edge that protrudes or extends farthest from component substrate 10 on a side of fender 20 opposite component substrate 10 (e.g., as shown in the left-most second-side fender 22 of FIG. 1 and FIGS. 6B, 6C, and 6F). Sharp points or edges on component substrate 10 of micro-component 99 can have a reduced radius of interaction with other structures (e.g., other component substrates 10 or micro-components 99), reducing or eliminating stiction between component substrate 10 and the other structures. In some embodiments, all first-side fenders 21 and second-side fenders 22 have a sharp point or sharp edge opposite component substrate 10. In some embodiments, at least one, at least two, at least three, or at least four fenders 20 on one or both sides of component substrate 10 have a sharp point or sharp edge. FIG. 3A illustrates cubic second-side fenders 22 and an elongated central second-side fender 22 with a rectangular, non-square cross section. FIG. 3B illustrates pyramidal first-side fenders 21 and an elongated central first-side fender 21 with an extended ridge and a triangular cross section. In some embodiments, a component substrate has one or more fenders 20 extending therefrom having a substantially sharp point or edge such that contact between the sharp point or edge and a component substrate 10 does not give rise to significant stiction between the point or edge and component substrate 10.

Figure 5A:
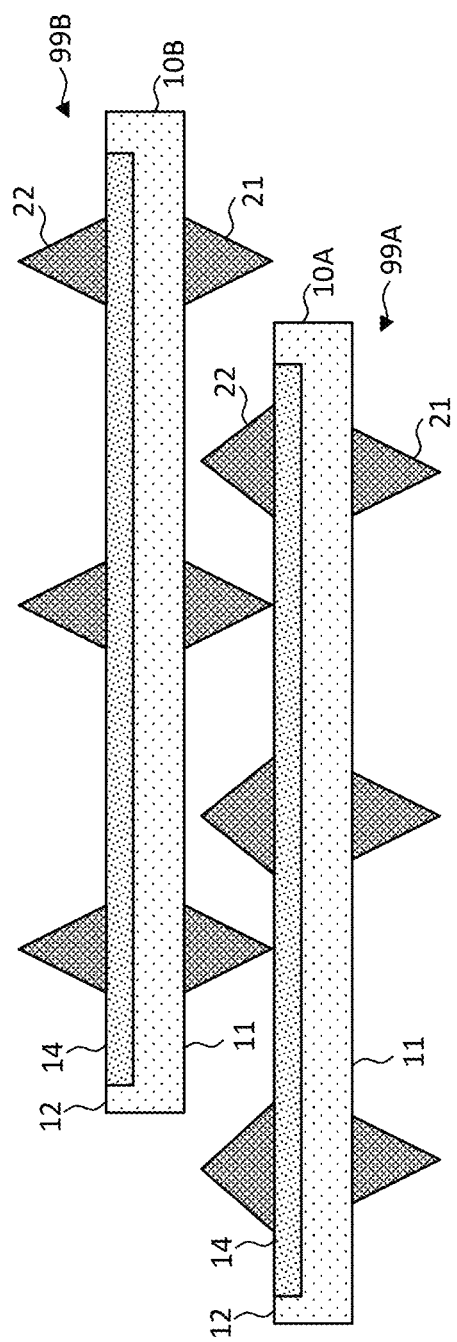
FIG. 5A is a schematic cross section and FIG. 5B is a perspective of areas of two micro-components spatially separated by fenders according to illustrative embodiments of the present disclosure.
Figure 5B:
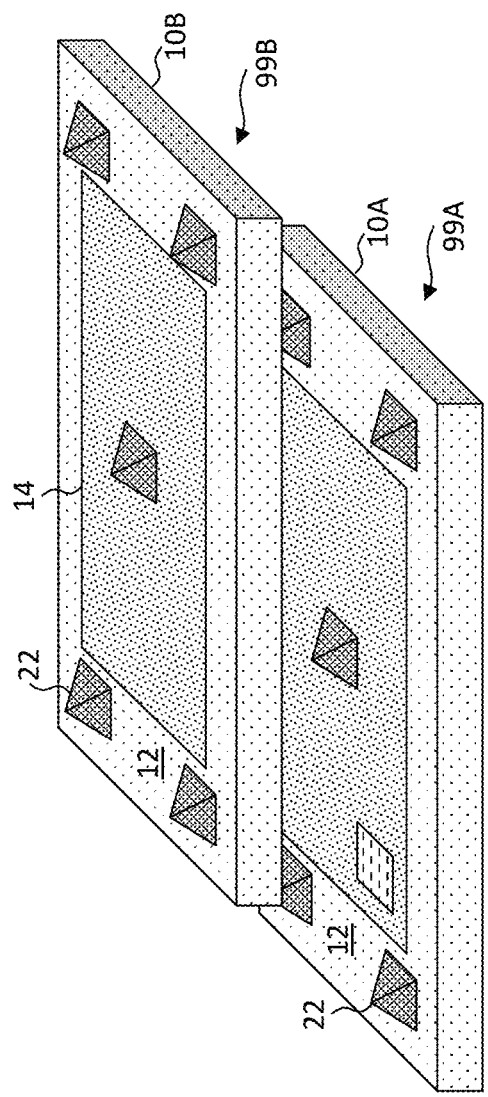

Referring to FIGS. 5A-5B, fender 20 is a structure on a first component substrate 10A of a first micro-component 99A that extends from a side or surface (e.g., first side 11 or second side 12) of first component substrate 10A and prevents a second component substrate 10B of a second micro-component 99B from sticking to first component substrate 10A, for example with short-range forces such as van der Waals forces, electrostatic forces, hydrogen bonding, or other close-range attractive forces that create stiction between first and second micro-components 99A and 99B. In particular, fenders 20 prevent a substantial area of first component substrate 10A from closely approaching a substantial area of second component substrate 10B by fending first component substrate 10A off of second component substrate 10B.

Figure 6A:
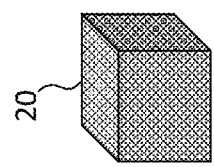
FIGS. 6A-6H are perspectives of fenders according to illustrative embodiments of the present disclosure.
Figure 6B:
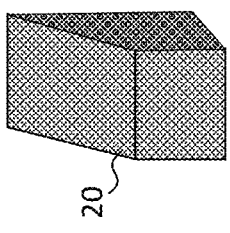
Figure 6C:
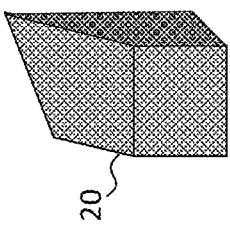
Figure 6D:
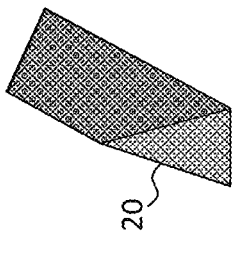
Figure 6E:
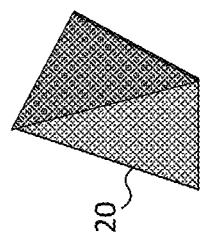
Figure 6F:
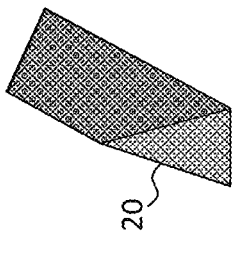
Figure 6H:
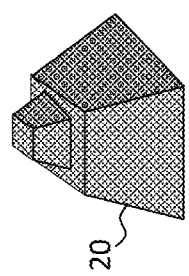
Figure 6G:
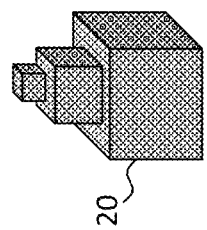

As illustrated in FIGS. 6A-6H, fenders 20 can have various shapes. In some embodiments as shown in FIGS. 6A-6D, fenders 20 have quadrilateral cross sections. In some embodiments and as shown in FIG. 6E, fenders 20 are pyramids. Fenders 20 can form elongated pyramids having ridges with triangular cross sections, as shown in FIG. 6F. In the embodiments of FIGS. 6G and 6H, fenders 20 are cubic and trapezoidal tiered structures, respectively. Tiered fenders 20 can have stacked successively smaller but geometrically similar layers. Fenders 20 shown in FIGS. 6B, 6C, and 6F have a sharp edge and fenders 20 shown in FIGS. 6C and 6E have a sharp point on a side of fender 20 opposite component substrate 10. As shown in FIGS. 1, 3B, 5A, and 5B, first-side fenders 21 are pyramidal (or have a triangular cross section) and second-side fenders 22 are not pyramidal, for example having a substantially planar surface on a side of second-side fender 22 opposite component substrate 10. As shown in FIGS. 2, 5A, and 5B, first-side fenders 21 and second-side fenders 22 are both pyramidal (or have a triangular cross section). Fenders 20 can have curved surfaces (not shown in the Figures).

Fenders 20 can have various sizes or heights, for example as shown in FIGS. 2 and 5A, ranging from tens of nanometers to 10 microns, or more, in a lateral (horizontal) or vertical (height) dimension with respect to a surface (e.g., first side 11 or second side 12) of component substrate 10. Fenders 20 with quadrilateral cross sections as shown in FIGS. 6A-6D can have sides of 15 microns and a height of 3-10 microns, for example approximately 5 microns high. In some embodiments as shown in FIG. 6E, pyramidal fenders 20 have sides of 15 microns and a height of 3-10 microns, for example approximately 5 microns.

Fenders 20 fend off one and physically separate substantial areas of one component substrate 10 from substantial areas of another component substrate 10 to prevent stiction between component substrate 10 areas when multiple micro-components 99 are co-located, as shown in the cross section of FIG. 5A, the perspective of FIG. 5B, and the illustration of FIG. 4C. In contrast, components of the prior art disposed in a container 90 without structures intended to control their relative position, for example as loose micro-components randomly positioned within a container, can agglomerate into clumps and can be difficult or impossible to subsequently separate.

According to some embodiments, stiction between the surfaces of fenders 20 can also be reduced. Although fenders 20 are much smaller in area than component substrates 10, if fenders 20 have a flat surface, for example the top of a cube, that can contact other fenders 20 with a flat surface or a component substrate 10, some stiction can occur between fenders 20 or between fender 20 and component substrate 10 or a container 90 surface. Such stiction can be reduced by providing fenders 20 with different sizes, shapes, or locations on component substrate 10. As shown in FIGS. 1-5A, by disposing first-side fenders 21 with a surface or face at a first angle to component substrate 10 and second-side fenders 22 with a surface or face at a second angle to component substrate 10 that is different from the first angle, by providing first-side fenders 21 with a different height, shape, or size than second-side fenders 22, by providing first-side fenders 21 with a different height, shape, or size than other first-side fenders 21, by providing second-side fenders 22 with a different height, shape, or size than other second-side fenders 22, or by any combination of these, the sides of fenders 20 sides are less likely to come into close contact over a significant or substantial area and stiction forces between fenders 20 or other structures are reduced, inhibited, or prevented.

Different fenders 20 in a common micro-component 99 can comprise different materials. Fenders 20 can comprise inorganic materials, for example metals such as aluminum, gold, silver, titanium, or tin, or dielectrics such as oxides (e.g., silicon dioxide), nitrides (e.g., silicon nitride), or organic materials, for example polymers, such as photoresists (e.g., SU-8), or epoxies. Fenders 20 can comprise layers of materials or structures, for example metal coated over an oxide or nitride structure. Fenders 20 can be electrically conductive, can be electrically connected to circuits 14 (or not), or fenders 20 can be an electrically non-conductive insulator and can be monolithic, comprising only one material, e.g., a dielectric material. In some embodiments, at least one fender 20 is an electrically conductive fender 20E, at least two fenders 20 are electrically conductive fenders 20E, at least one first-side fender 21 is an electrically conductive fender 20E, at least two first-side fenders 21 are electrically conductive fenders 20E, or at least two second-side fenders 22 are electrically conductive fenders 20E, or any one or combination of these. In some embodiments, one or more electrically conductive fenders 20E are electrically connected to circuit 14. In some embodiments, one or more electrically conductive fenders 20E are isolated from, and are not electrically connected to, circuit 14. In some embodiments, at least one fender 20 is electrically non-conductive, at least two fenders 20 are electrically non-conductive, at least one first-side fender 21 is electrically non-conductive, at least two first-side fenders 21 are electrically non-conductive, or at least two second-side fender 22 are electrically non-conductive, or any one or combination of these. In some embodiments, one or more fenders 20 are isolated from, and are not electrically connected to, circuit 14. In some embodiments, all of first-side fenders 21 are electrically insulating and all but one of second-side fenders 22 are electrically insulating, or all of second-side fenders 22 are electrically insulating.

Figure 7A:
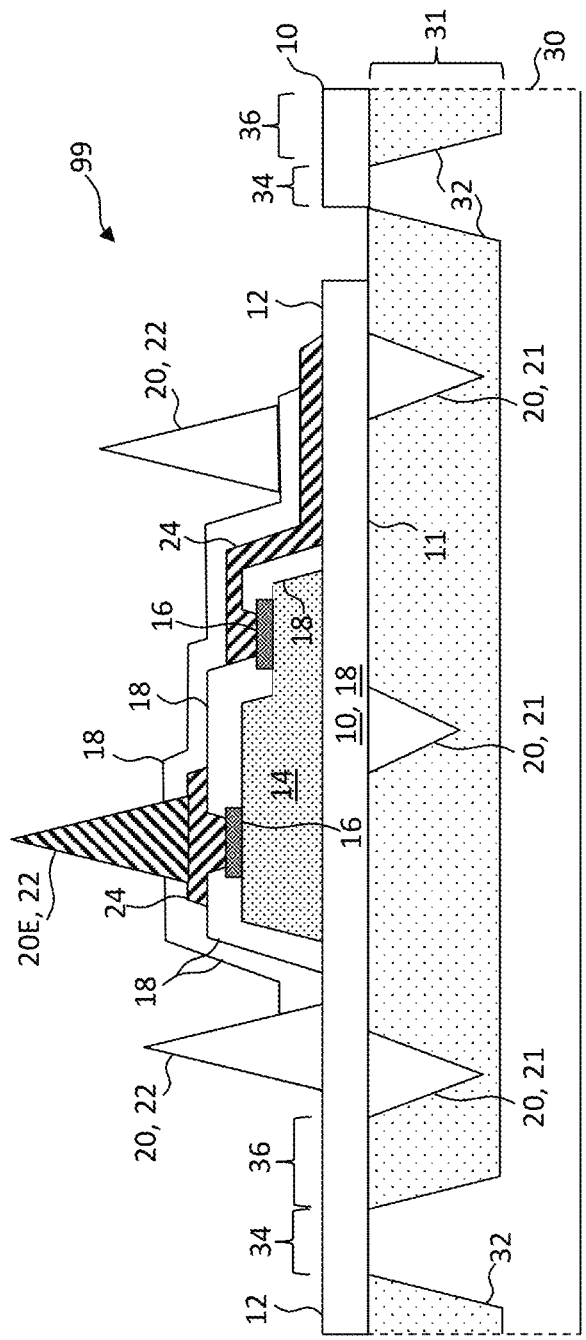
FIGS. 7A and 7B are schematic cross sections of a source wafer and a micro-component with fenders illustrating embodiments of the present disclosure.
Figure 7B:
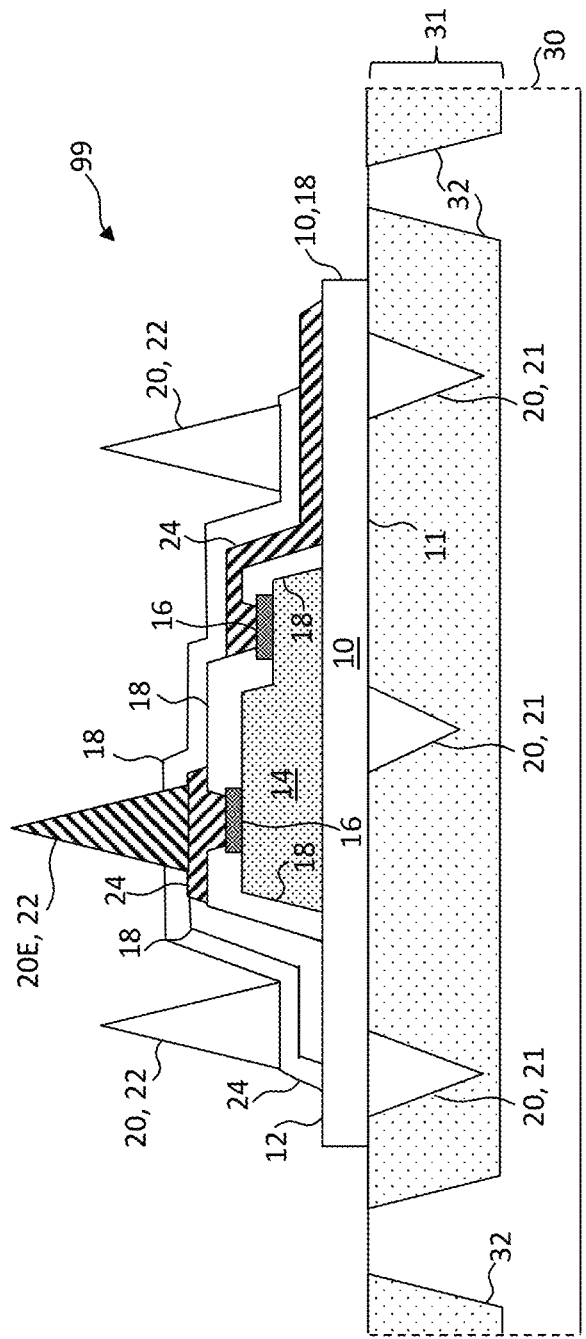

Micro-components 99 comprising fenders 20 of the present disclosure can be constructed on a source wafer 30, as shown in FIGS. 7A and 7B. Source wafer 30 can comprise a patterned sacrificial layer 31 having sacrificial portions 32 separated by anchors 34. Micro-components 99 are constructed entirely and directly over sacrificial portions 32 leaving sacrificial material between micro-components 99, anchors 34, and source wafer 30. When a liquid or gaseous etchant is introduced into the sacrificial material, sacrificial portions 32 are etched away. Thus, sacrificial portion 32 is differentially etchable from component substrate 10. Source wafer 30 can comprise a semiconductor material, for example crystalline silicon or a glass. Sacrificial layer 31 can comprise a semiconductor material or an etchable oxide or nitride layer, for example crystalline silicon, silicon dioxide, or silicon nitride. Similarly, sacrificial portions 32 can comprise a semiconductor material or an etchable oxide or nitride layer, for example crystalline silicon, silicon dioxide, or silicon nitride. In some embodiments, sacrificial portions 32 comprise an anisotropically etchable crystalline semiconductor, for example silicon {111} that can be etched at 54.7 degrees to release micro-components 99 from source wafer 30. In some embodiments, sacrificial portions 32 are buried oxide or buried nitride layers.

In some embodiments and as illustrated in FIG. 7A, micro-components 99 are physically attached to anchors 34 with tethers 36 after sacrificial portions 32 are etched to release micro-components 99 from source wafer 30 so that micro-components 99 can be removed from source wafer 30 by micro-transfer printing, for example with a stamp. In some embodiments, as illustrated in FIG. 7B, micro-components 99 are not connected to an anchor 34 and can simply float away, for example by washing source wafer 30 in an ultrasonic bath. In this case, fenders 20 can help prevent or inhibit micro-components 99 from sticking to source wafer 30 or any flat-wall surfaces of container 90, to other structures in the bath, or to bath structures (e.g., any bath walls or floor). FIG. 7A has a tether 36 to maintain alignment between micro-component 99 and source wafer 30 and FIG. 7B does not have such a tether 36.

As shown in FIGS. 7A and 7B, micro-components 99 can comprise integrated circuits 14 disposed on a dielectric 18 layer (component substrate 10) and coated with patterned dielectric 18 materials to provide electrical insulation to micro-component 99. Thus, non-conductive fenders 20 can comprise a same dielectric material as dielectric 18 and can be deposited or formed in a common step, for example first-side fenders 21 can be constructed together with component substrate 10 using a common material e.g., silicon dioxide, with common deposition and patterning processes and steps. Electrodes 24 can provide electrical connections to component contact pads 16 electrically connected to circuit 14. In some embodiments, second-side fenders 22 can be electrically conductive fenders 20E or connection posts that are electrically connected to circuit 14 through electrodes 24 and component contact pad 16. In some embodiments, second-side fenders 22 can be electrically conductive fenders 20E that are not electrically connected to circuit 14 and are coated with an electrical conductor (e.g., a metal such as aluminum) as part of the fender 20 construction process. In some embodiments, second-side fenders 22 comprise monolithic dielectric material and are electrically insulating. As illustrated in FIGS. 7A and 7B, the central second-side fender 22 is electrically connected to circuit 14 through electrodes 24 but the other second-side fenders 22 are not. Thus, in some embodiments, none of fenders 20 is electrically conductive. In some embodiments, some but not all fenders 20 are electrically conductive fenders 20E. In some embodiments, none of fenders 20 is electrically connected to circuit 14. In some embodiments, some but not all fenders 20 are electrically conductive fenders 20E electrically connected to circuit 14. In some embodiments, after micro-components 99 are deposited on or in a desired structure or surface, electrically conductive fenders 20E electrically connected to circuit 14 are electrically connected to electrical devices, connections, or wires on or in the desired structure or surface, for example using photolithographic or printed circuit boards methods and materials.

First-side fenders 21 can be constructed, in some embodiments, on a crystalline silicon sacrificial portion 32 by etching pyramidal depressions or forms corresponding to the silicon crystal structure in a crystalline silicon sacrificial portion 32. Thus, the pyramidal depression forms a protrusion into sacrificial portion 32. The pyramidal depression is then filled and coated with dielectric 18 (e.g., silicon dioxide or silicon nitride) to form component substrate 10 and first-side fenders 21 extending from first side 11 of component substrate 10. When formed in anisotropically etchable crystalline material (e.g., silicon {111} having slow-etching planes and fast-etching planes) different height fenders 20 can be formed by masking different size exposed areas and etching into the exposed areas until the etching self-annihilates against the slow-etching plane of the crystal. For example, an area of 15 microns square will etch to a pyramidal depression that has a smaller depth than an etched area of 25 microns square. A crystalline silicon sacrificial portion 32 can be anisotropically and differentially etched, for example with TMAH or KOH, from component substrate 10, for example comprising a metal or dielectric layer (such as silicon dioxide or silicon nitride), to release micro-component 99 from source wafer 30.

According to some embodiments, fenders 20 can be made by coating and then pattern-wise curing materials such as resins or metals that can be etched. Fenders 20 can be a semiconductor material, such as silicon or GaN, formed by etching material from around fender 20. Coatings can be evaporated or sputtered over fender 20 structure and then pattern-wise etched to form a multi-layer fender 20. Fenders 20, for example second-side fenders 22, can be constructed by repeated photolithographic masking and deposition processes that build up three-dimensional structures, for example tiered structures such as those shown in FIGS. 6G and 6H. For example, fenders 20 can be made by etching one or more layers of coated resin or metal evaporated or sputtered on the process side of component substrate 10 or circuit 14. Fenders 20 can be made by coating and then pattern-wise curing materials such as resins or by depositing etchable materials. Such structures can also be made by forming a layer above a component substrate 10 or circuit 14 surface (e.g., first side 11 or second side 12), etching a well into the surface, filling it with a material, and then removing the layer. These process steps can be repeated with successively smaller stacked structures to form a tiered fender 20. Each layer of the tiered fender 20 can be smaller in size and, optionally, can be geometrically similar in shape and, optionally, can be similar in structure.

In some embodiments, second-side fenders 22 are made of one or more high elastic modulus metals, such as tungsten. Second-side fenders 22 can be made of aluminum, titanium, tungsten, copper, silver, gold, or other conductive metals, or layers of photo-patternable dielectric organic materials such as a photoresist (e.g., SU-8), for example. Fenders 20 can have a roughened surface to further reduce stiction. A roughened surface can be formed by, for example, exposure to a plasma.

Figure 8A:
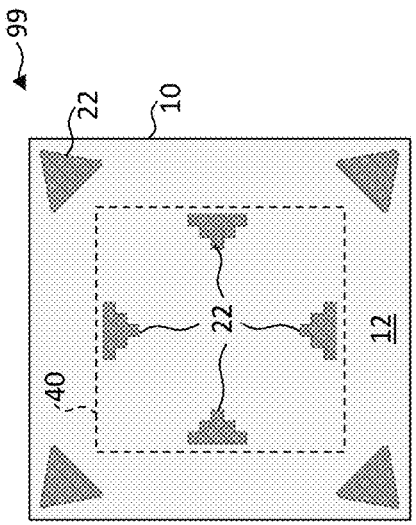
FIG. 8A is a bottom plan view.
Figure 8B:
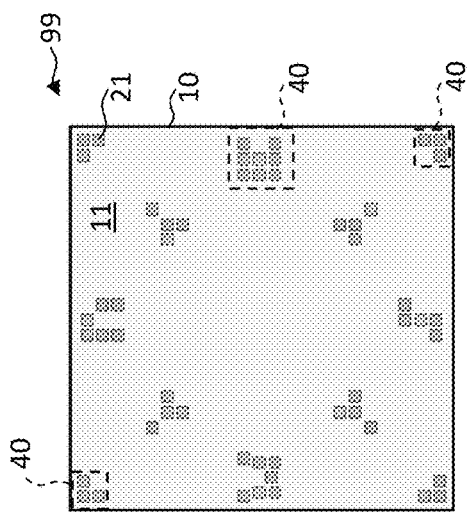
FIG. 8B is a top plan view.
Figure 8C:
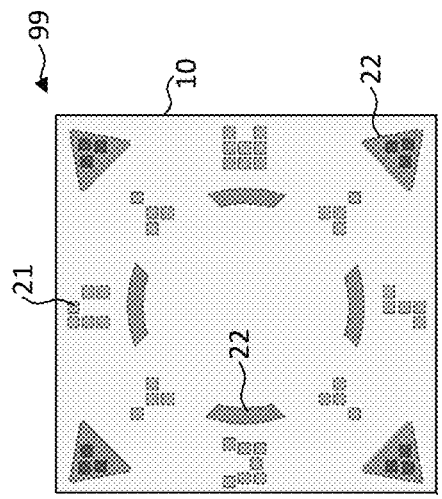
FIG. 8C is a transparent plan view.

According to some embodiments of the present disclosure and as illustrated in micro-components 99 of FIGS. 8A-8E, fenders 20 can also be, comprise, or be a portion of an alignment structure. As is generally known in the art, fiducial marks serve as a point of comparison, for example as a point of reference or measurement for spatial alignment and are often used in photolithographic processes to align substrates and masks. Fenders 20 of the present disclosure can each be an alignment structure (e.g., an orientation structure, a directional structure, or a fiducial mark). In some embodiments, fender groups 40 of fenders 20 also serve as an alignment structure and can provide a directional as well as a point reference, thus forming an orientation alignment structure. As shown in FIG. 8A, fender groups 40 of first-side fenders 21 are disposed at corners R and edges of component substrate 10. In some embodiments, first-side fenders 21 all have the same structure and shape but fender groups 40 of first-side fenders 21 have differing arrangements of first-side fenders 21, where the arrangements can indicate or encode information, such as location, position, or orientation information. Similarly, FIG. 8B illustrates second-side fenders 22 different from first-side fenders 21, some of which are disposed in fender groups 40. In some embodiments, fenders 20, whether first-side fenders 21 or second-side fenders 22, are disposed (e.g., on a side of component substrate 10) in an arrangement (e.g., including one or more fender groups 40) that indicates or encodes information, such as, for example, a property or characteristic (e.g., functionality or operating parameter(s)) of circuit 14 included in micro-component 99 or information that identifies the circuit (e.g., a serial number or other identification information). In FIG. 8B, second side-fenders 22 comprise two different shapes, both different from shapes of first-side fenders 21, that can also form orientation alignment structures. Second-side fenders 22 having one shape are disposed near corners R of component substrate 10 with different rotations and indicate orientation, location, and direction and second-side fenders 22 having another different shape indicating orientation, location, and direction are disposed in the interior of component substrate 10. FIG. 8C is a top view illustrating both the bottom of first-side fenders 21 and second-side fenders 22. FIG. 8D is a perspective of second side 12 of micro-component 99 with second-side fenders 22 indicated as well as the bottom of first-side fenders 21. FIG. 8E is a perspective of first side 11 of micro-component 99 with first-side fenders 21 indicated. In some embodiments, where first-side fenders 21 and second-side fenders 22 form different alignment structures, they can be used to differentiate first side 11 from second side 12.

Figure 9A:
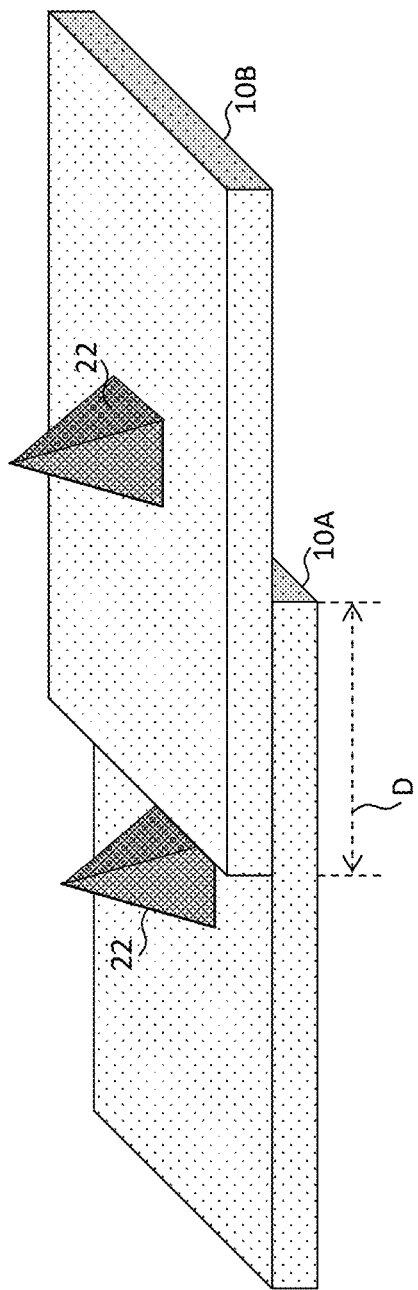
FIG. 9A is a perspective illustrating the ends of two component substrates with fenders at their center sticking together useful in understanding embodiments of the present disclosure.
Figure 9B:
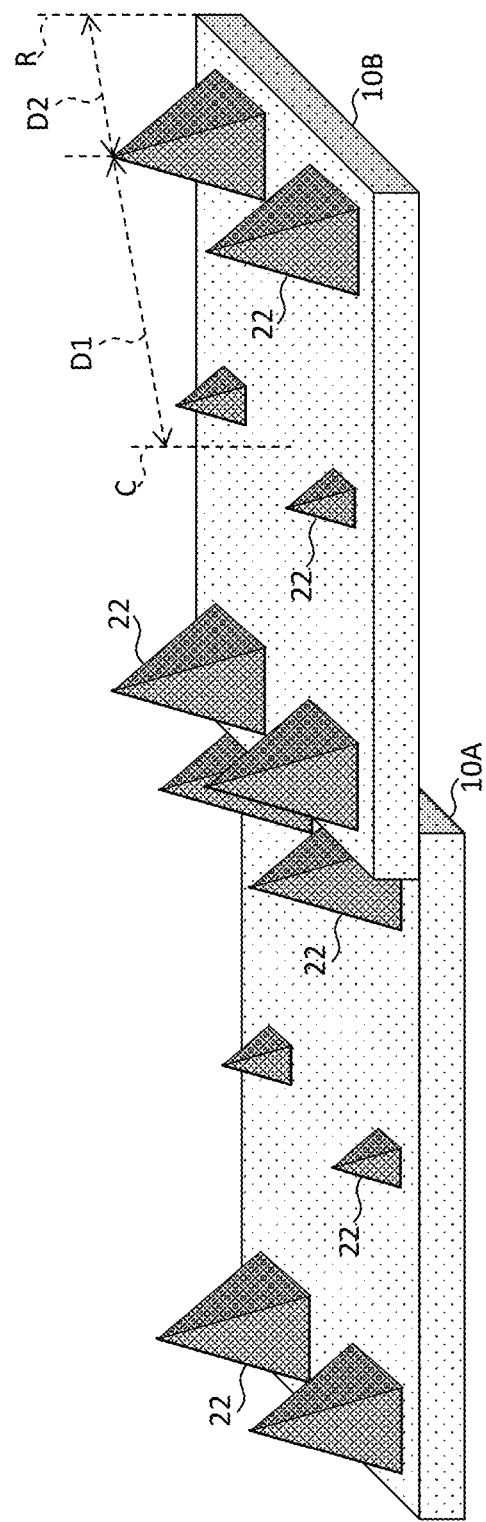
FIG. 9B is a perspective illustrating arrangements of fenders close to the edges and corners of component substrates that prevent or inhibit the ends of two component substrates sticking according to illustrative embodiments of the present disclosure.

According to some embodiments of the present disclosure, fenders 20 can be disposed at any location on first side 11 or second side 12 of component substrate 10. As shown in FIG. 9A, if fenders 20 are only disposed near a center C of component substrate 10, nearly half of an area of a first component substrate 10A, can still align in close proximity or contact and can experience stiction with another portion of a different second component substrate 10B, for example overlapping by a distance D (as also shown in FIG. 4A). Similarly, but to a lesser extent, fenders 20 disposed only on edges of component substrate 10 can still align and experience stiction with another portion of a different component substrate 10. According to embodiments of the present disclosure, if fenders 20 are disposed near corners of a rectangular surface of component substrate 10, for example closer to a corner R by distance D2 than a distance D1 to center C of a component substrate 10, the area available for a first component substrate 10A and a different second component substrate 10B to stick to each other is greatly reduced by the presence of fenders 20, preventing or inhibiting the two different first and second component substrates 10A, 10B from experiencing stiction, as shown for multiple fenders 20 in FIG. 9B. Therefore, according to some embodiments of the present disclosure, a component substrate 10 has a center C and one or more corners R and one or more of fenders 20 is each closer to one of one or more corners R of component substrate 10 than to center C of component substrate 10.

Figure 10B:
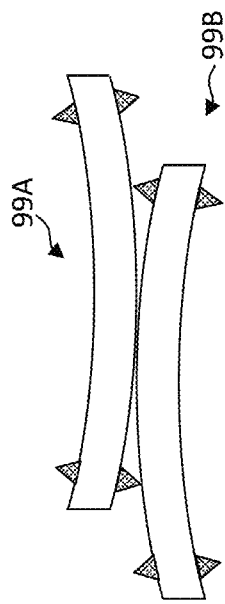
Figure 10D:
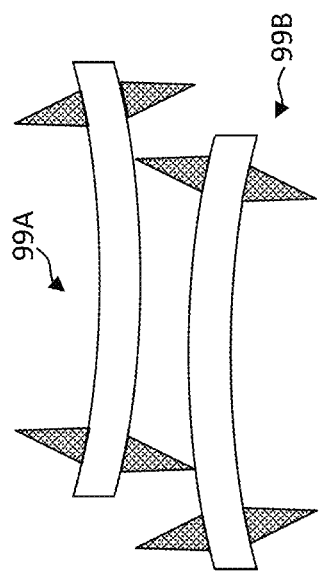
Figure 10A:
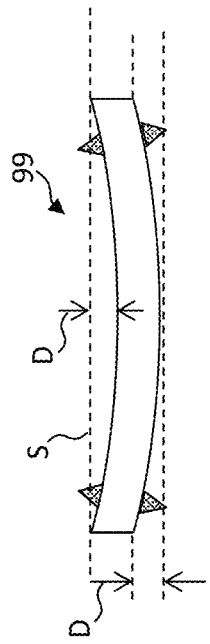
Figure 10C:
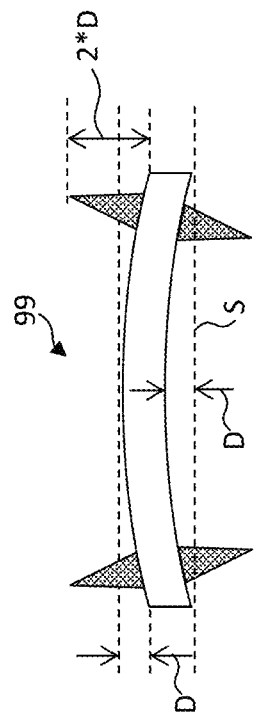

Small micro-components 99 can be subject to stresses that curve or bend micro-components 99, for example due to adjacent layers in a stack on or in component substrate 10 that have different crystalline structures or thicknesses, that can expose a portion of a surface of component substrate 10. Furthermore, external mechanical stress can bend a component substrate 10 of a micro-component 99. As shown in FIGS. 10A-10D, stiction forces between a bent or curved micro-component 99 can be reduced or prevented by providing fenders 20 that have a height greater than or equal to distance D between a secant S intersecting the ends of component substrate 10 and a center C of component substrate 10 on a common side or surface of component substrate 10, where component substrate 10 is bent or curved. FIG. 10A illustrates embodiments in which fenders 20 are equal in height to distance D. FIG. 10B shows two curved micro-components 99 with such fenders 20 in physical contact with a reduced contact area. FIG. 10C illustrates embodiments in which fenders 20 are twice the height of distance D. FIG. 10D shows two curved micro-components 99 with such fenders 20 in physical contact and no contact area. In some embodiments, fenders 20 have a height that is greater than or equal to twice distance D between a secant S intersecting the ends of component substrate 10 and a center C of component substrate 10 on a common side or surface of component substrate 10. The curve can be less than or equal to the maximum curve or bending that micro-component 99 or component substrate 10 can undergo without cracking or fracturing micro-component 99, component substrate 10, or structures or circuits 14 on component substrate 10. FIG. 10E illustrates a micro-component 99 with additional fenders 20 disposed at edges or in a central area of micro-components 99. Additional fenders 20 further reduce the likelihood of stiction between pairs of micro-components 99.

Micro-component 99 can have a length or width in the micro range, for example micro-component 99 can have at least one of a length and a width no greater than 5 microns, 10 micron, 20 microns, 50 microns 100 microns, 200 microns, or 500 microns. Micro-components 99 having such sizes can be constructed with sufficiently planar surfaces that stiction forces can affect handling of micro-component 99 and can therefore benefit from fenders 20 as disclosed herein.

Figure 11A:
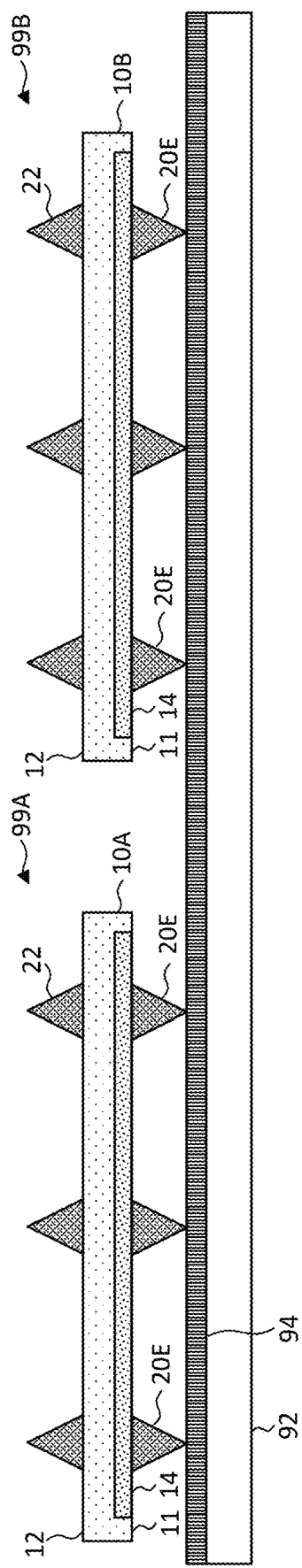
FIGS. 11A and 11B illustrate electrically connected micro-components disposed on a target substrate according to illustrative embodiments of the present disclosure.
Figure 11B:
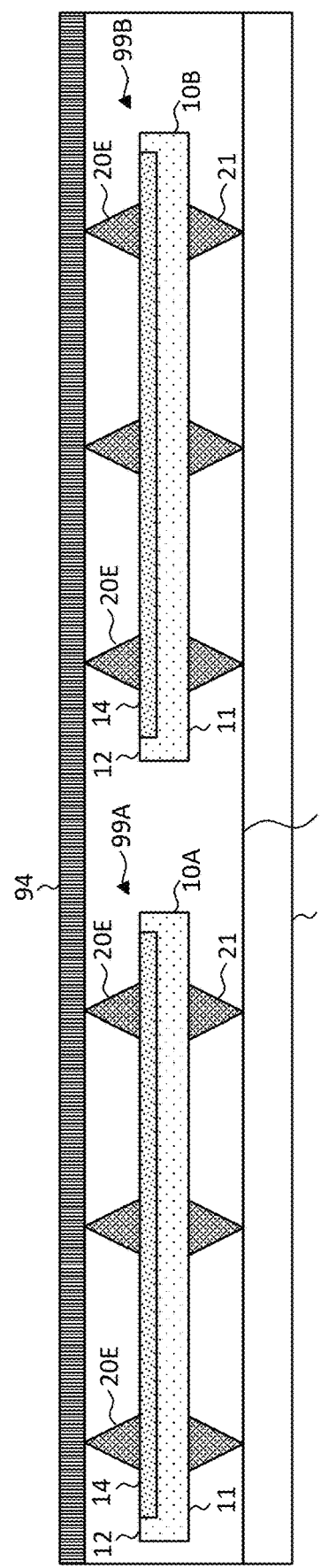

Micro-components 99 can be removed from a source wafer 30 by under-etching micro-components 99 on source wafers 30 to release micro-components 99 from source wafers 30 and then, for example, washing source wafer 30 and micro-components 99 or submerging source wafer 30 and micro-components 99 in a bath, for example an ultrasonic bath. Sonic vibrations and fenders 20 can separate micro-components 99 from source wafer 30. After removal of source wafer 30, detached or separated micro-components 99 can be disposed in a container 90 (as shown in FIG. 4C). In some embodiments, micro-components 99 remain suspended in a liquid and are then dispersed on target substrate 92. In some embodiments, micro-components 99 are dried and then dispersed on target substrate 92. When provided with a suitable container 90 opening, e.g., a sieve, vibration of container 90 and fenders 20 can separate micro-components 99 from each other and dispense micro-components 99 over a surface of target substrate 92. A density of micro-component 99 distribution over the target substrate 92 can be controlled by the magnitude or frequency of vibration or by moving the target substrate 92 relative to container 90 at a desired (e.g., controlled) rate, or any combination thereof. In some embodiments, once micro-components 99 are dispersed on target substrate 92, they can be operated as designed. In some embodiments, target substrate 92 is at least partially conductive (e.g., comprises a conductive surface layer 94 on the surface on which micro-components 99 are disposed) and micro-components 99 are electrically connected through electrically conductive fenders 20E, and therefore operational, due to target substrate 92, for example as shown in FIG. 11A. In some embodiments, micro-components 99 are electrically connected through electrically conductive fenders 20E after being disposed on a target substrate (e.g., by disposing planarizing layer 96 and subsequently electrically conductive layer 94), for example as shown in FIG. 11B. Micro-components 99 can be electrically connected using electrically conductive fenders 20E extending from different sides of component substrate 10. Target substrate 92 can be transparent.

Source wafers 30 can be compound semiconductor or silicon wafers and patterned sacrificial layer 31, sacrificial portions 32, and circuits 14 can be made using photolithographic methods and materials found in the integrated circuit industries. For example, a source wafer 30 can be GaN, InGaN, or GaAs. Circuit 14 can be or comprise inorganic light-emitting diodes made in a semiconductor material, such as a compound semiconductor (e.g., GaN or GaAs, with or without doping), piezo-electric structures, photovoltaic structures, or integrated circuits. Micro-components 99 can have a width from 2 to 500 µm (e.g., 2 to 5 µm, 5 to 10 µm, 10 to 20 µm, or 20 to 50 µm, 50 to 100 µm, 100 to 250 µm, or 250 to 500 µm), can have a length from 2 to 500 µm (e.g., 2 to 5 µm, 5 to 10 µm, 10 to 20 µm, or 20 to 50 µm, 50 to 100 µm, 100 to 250 µm, or 250 to 500 µm), or can have a height from 2 to 500 µm (e.g., 2 to 5 µm, 5 to 10 µm, 10 to 20 µm, or 20 to 50 µm). For example, LEDs can have a thickness of 2 to 10 µm (e.g., 2-5 µm or 5-10 µm), piezoelectric power devices can have a thickness of 3 to 12 µm (e.g., 3-6 µm or 6-12 µm), and integrated circuits can have a thickness of 5 to 20 µm (e.g., 5-10 µm or 10-20 µm), Methods of forming useful micro-component 99 structures are described, for example in U.S. Pat. No. 8,889,485. For a discussion of sacrificial portions 32 and releasable structures see U.S. Pat. Nos. 8,722,458, 7,622,367 and 8,506,867, the disclosures of which are hereby incorporated by reference in their entirety. Compound micro-assembly structures and methods can also be used with the present disclosure, for example, as described in U.S. patent application Ser. No. 14/822,868, filed Aug. 10, 2015, entitled Compound Micro-Assembly Strategies and Devices, the disclosure of which is hereby incorporated by reference in its entirety. In some embodiments, micro-component 99 is a compound micro-assembled device.

Micro-components 99 can be constructed using foundry fabrication processes used in the art. Layers of materials can be used, including materials such as metals, oxides, nitrides and other materials used in the integrated-circuit art. Each micro-component 99 can be or include a complete semiconductor integrated-circuit and can include, for example, transistors. Micro-components 99 can have different sizes, for example, no more than 1000 square microns, 10,000 square microns, 100,000 square microns, or 1 square mm, or larger, and can have variable aspect ratios, for example at least 1:1, 2:1, 5:1, or 10:1. Micro-components 99 can be rectangular or can have other shapes.

As will be understood by one of ordinary skill in the art, details of the following patents and applications can be applied to embodiments of the present disclosure: U.S. Pat. No. 8,889,485, entitled Methods for Surface Attachment of Flipped Active Components by Bower, U.S. Pat. No. 10,468, 363, entitled Chiplets with Connection Posts by Prevatte et al., U.S. Pat. No. 10,222,698, entitled Chiplets with. Wicking Posts, by Prevatte et al., U.S. patent application Ser. No. 14/823,917, entitled Printable Component Structure with Electrical Contact by Meitl et al., and U.S. patent application Ser. No. 16/722,935, entitled Methods of Making Printed Structures, by Bower et al., the disclosures of each of which are incorporated herein by reference in their entirety.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

C center
D, D1, D2 distance
R corner
S secant
10 component substrate
10A first component substrate
10B second component substrate
11 first side
12 second side
14 circuit/integrated circuit
16 component contact pad
18 dielectric
20 fender
20E electrically conductive fender
21 first-side fender
22 second-side fender
24 component electrode
30 source wafer
31 sacrificial layer
32 sacrificial portion
34 anchor
36 tether
40 fender group
90 container
92 target substrate
94 electrically conductive layer/conductive surface layer
96 planarizing layer
99 micro-component
99A first micro-component
99B second micro-component

The invention claimed is:

1. A micro-component, comprising:
a component substrate having a first side;
fenders extending from the first side of the component substrate,
wherein (i) at least two of the fenders have a nonconductive surface and (ii) the fenders are arranged to indicate or encode information.

2. The micro-component of claim 1, wherein the micro-component comprises a circuit disposed on or in the component substrate and the information is (i) a property or characteristic of the circuit or (ii) identification information that identifies the circuit.

3. The micro-component of claim 1, wherein the fenders are each disposed closer to a corner of the component substrate than to a center of the component substrate.

4. The micro-component of claim 1, wherein the fenders are pyramidal.

5. The micro-component of claim 1, wherein (i) the fenders are a solid dielectric, (ii) the fenders comprise a same material as the component substrate, or both (i) and (ii).

6. The micro-component of claim 1, wherein the fenders comprise (i) one or more fenders having a substantially sharp point on a side of the fender opposite the component substrate, (ii) one or more fenders having a substantially sharp edge on a side of the fender opposite the component substrate, or (iii) both (i) and (ii).

7. A method of providing micro-components on a target substrate, the method comprising:
    providing a target substrate and a container having micro-components disposed loosely in the container, wherein each of the micro-components comprises
        a component substrate having a first side and a second side opposite the first side,
        a circuit disposed in or on the component substrate, and
        fenders, each of the fenders extending from one of the first side and the second side; and
    vibrating the container with a selected magnitude and frequency of vibration such that a plurality of the micro-components is dispensed from the container onto the target substrate.

8. The method of claim 7, comprising moving the target substrate relative to the container at a desired rate while vibrating the container.

9. The method of claim 7, wherein at least two of the fenders extends from the first side and at least one of the fenders extends from the second side.

10. The method of claim 7, wherein the fenders are each disposed closer to a corner of the component substrate than to a center of the component substrate.

11. The method of claim 7, wherein at least two of the fenders have a non-conductive surface.

12. The method of claim 7, wherein at least two of the fenders are electrically conductive and the method comprises electrically connecting at least two of the fenders.

13. A micro-component system, comprising:
    a container;
    a plurality of micro-components, each of the micro-components comprising:
        a component substrate having a first side and an opposing second side;
        fenders comprising first-side fenders extending from the first side of the component substrate and a second-side fender extending from the second side of the component substrate,
        wherein at least two of the first-side fenders have a non-conductive surface and are each disposed closer to a corner of the component substrate than to a center of the component substrate, and
    wherein the plurality of micro-components are disposed loosely in the container.

14. The micro-component of claim 13, wherein (i) the first-side fenders are a solid dielectric, (ii) the first-side fenders comprise a same material as the component substrate, or both (i) and (ii).

15. The micro-component of claim 13, wherein the fenders comprise (i) one or more fenders having a substantially sharp point on a side of the fender opposite the component substrate, (ii) one or more fenders having a substantially sharp edge on a side of the fender opposite the component substrate, or (iii) both (i) and (ii).

16. The micro-component of claim 13, wherein the first-side fenders are pyramidal.

17. The micro-component of claim 13, comprising a circuit disposed in or on the component substrate.

18. The micro-component of claim 13, wherein one or more of the fenders extends no less than five microns from a surface of the component substrate.

19. The micro-component of claim 13, wherein the component substrate is curved and a height of at least one of the fenders is greater than or equal to the distance orthogonally between a secant intersecting ends of the component substrate and the center of the substrate.

20. The micro-component of claim 19, wherein the height of at least one of the fenders is greater than or equal to twice a distance orthogonally between a secant intersecting ends of the substrate and the center of the substrate.

* * * * *